United States Patent [19]

Ahn

[11] Patent Number: 5,953,616
[45] Date of Patent: Sep. 14, 1999

[54] METHOD OF FABRICATING A MOS DEVICE WITH A SALICIDE STRUCTURE

[75] Inventor: Jae Gyung Ahn, Chungcheongbuk-do, Rep. of Korea

[73] Assignee: LG Semicon Co., Ltd., Cheongju, Rep. of Korea

[21] Appl. No.: 09/074,595

[22] Filed: May 8, 1998

[30] Foreign Application Priority Data

Sep. 26, 1997 [KR] Rep. of Korea ...................... 97-49220

[51] Int. Cl.$^6$ ................................................. H01L 21/336
[52] U.S. Cl. .......................... 438/305; 438/96; 438/264; 438/303; 438/529
[58] Field of Search .................................. 438/305, 260, 438/482, 491, 301, 306, 375, 915, 922, 966, 96, 263, 264, 303, 307, 376, 529, 530

[56] References Cited

U.S. PATENT DOCUMENTS

| | | | |
|---|---|---|---|
| 3,615,875 | 10/1971 | Morita et al. | 438/346 |
| 5,585,286 | 12/1996 | Aronowitz et al. | 437/24 |
| 5,648,287 | 7/1997 | Tsai et al. | 438/305 |
| 5,656,519 | 8/1997 | Mogami | 438/303 |
| 5,677,213 | 10/1997 | Lee | 438/305 |
| 5,770,485 | 6/1998 | Gardner et al. | 438/306 |
| 5,793,090 | 8/1998 | Gardner et al. | 438/305 |
| 5,858,849 | 1/1999 | Chen | 438/305 |

OTHER PUBLICATIONS

"A Ti Salicide Process for 0.10 μm Gate Length CMOS Technology", Kittl et al., Symposium on VLSI Technology Digest of Technical Paper, pp. 14–15.

Primary Examiner—Charles Bowers
Assistant Examiner—Jack Chen
Attorney, Agent, or Firm—Fleshner & Kim

[57] ABSTRACT

A method of fabricating an MOS device that includes self-aligned suicides, the method including two amorphization implantations, both of which follow formation of the self-aligned source/drain regions of the device but precede formation of the self-aligned suicides. The first consists of implantation of low-energy heavy ions, preferably of energies 15–20 keV, while the second consists of implantation of more energetic heavy ions, preferably of energies at least 40 keV.

20 Claims, 5 Drawing Sheets

METHOD OF FABRICATING A MOS DEVICE WITH A SALICIDE STRUCTURE

BACKGROUND OF THE INVENTION

1. Field of the Invention

The present invention relates to a method of fabricating a metal oxide semiconductor (MOS) device and, more particularly, to a method of fabricating an MOS device that includes a self-aligned silicide (salicide) structure.

2. Discussion of Related Art

Process steps of a conventional method of fabricating an MOS device that includes a salicide structure are described immediately below with reference to the idealized cross-sectional views of FIGS. 1A–1F.

As shown in FIG. 1A, a thin, insulating thermal oxide film 102a is grown on the surface of a lightly-doped silicon substrate 101 of a first conductivity type and a doped polysilicon layer 103a is formed on the thin oxide film. After a first photoresist coating has been spun onto the polysilicon layer, the photoresist coating is patterned by means of conventional exposure and development process steps to form a photoresist pattern 104.

Masked by the photoresist pattern 104, the doped polysilicon layer 103a is etched in order to form regularly-spaced, parallel, doped polysilicon gate electrode strips 103, as shown in FIG. 1B. (Each polysilicon gate electrode consists of multiple single-crystal silicon regions, which are called grains or crystallites, separated by grain boundaries. Although the as-deposited polysilicon of the gate electrodes may be amorphous, it subsequently becomes polycrystalline as a consequence of post-deposition processing at elevated temperatures.)

After the photoresist pattern 104 has been removed, a low dose of low energy dopants of a second conductivity type is implanted into the substrate, which is masked by the gate electrodes 103, and then electrically activated by means of a thermal process in order to form shallow, lightly-doped source/drain regions 105 within the substrate to either side of each of the gate electrodes 103. (Alternatively, the photoresist pattern may be removed after, rather than before, the implantation has been performed.) Lightly-doped source/drain regions 105 are thus self-aligned to each of the gate electrodes 103.

As shown in FIG. 1C, an oxide layer is deposited over the surface of the substrate and then etched back to form oxide sidewall spacers 106 contiguous to either side of each of the gate electrodes 103. To facilitate the description below, a gate electrode structure is defined to consist of a gate electrode 103 and the sidewall spacers 106 contiguous to that electrode.

As shown in FIG. 1D, a higher dose of energetic dopants of the second conductivity type is implanted into the substrate, which is masked by the gate electrode structures, and then electrically activated by means of a thermal process in order to form heavily-doped source/drain regions 107 within the substrate to either side of each of the gate electrode structures. (Alternatively and more economically, dopants that will comprise both the lightly-and heavily-doped source/drain regions may be electrically activated at the same time by means of a single thermal process after the later implantation.) Heavily-doped source/drain regions 107 are thus self-aligned to each of the gate electrode structures and extend further beneath the surface of the substrate than do the lightly-doped source/drain regions 105. Additional grain boundaries 108 are generated in the polysilicon gate electrodes 103 during implantation of the dopants that will comprise the source/drain regions.

As shown in FIG. 1E, heavy ions of the second conductivity type (typically As⁻ for a lightly-doped p-type substrate or $BF_2^+$ for a lightly-doped n-type substrate) are implanted into the substrate and the gate electrodes in order to form amorphous layers 109 adjacent to the surface of the single-crystal silicon substrate above each of the heavily-doped source/drain regions 107 and adjacent to the upper surface of each of the polysilicon gate electrodes 103. (Adjacent may or may not imply contact, but always implies the absence of anything of the same kind in between.) Amorphization with heavy ions reduces channeling effects and thus facilitates the formation of shallow silicide layers at the surfaces of the single-crystal silicon substrate and the polysilicon gate electrodes. The energetic heavy ions of a conventional amorphization process can easily pass through the grain boundaries of the polysilicon gate electrodes.

As shown in FIG. 1F, a metal layer (typically consisting of titanium) is deposited over the upper surface of the substrate, which is masked by the gate electrode structures, and then annealed. Silicon of the amorphized regions 109 of the polysilicon gate electrodes 103 and the single-crystal silicon substrate reacts with the deposited metal to form silicide layers 111 of uniform electrical and mechanical properties at the surface of each of the gate electrodes 103 and at the surface of the substrate above each of the heavily-doped source/drain regions 107. The silicides thus formed at the surface of the single-crystal silicon substrate are refefred to a salicide structure, since they are self-aligned to the gate electrode structures and are formed at the same time as the polycides (i.e., polycrystalline silicides) at the surface of each of the gate electrodes. Unreacted metal, deposited, for example, on the insulating gate sidewall spacers, is removed by means of a selective etch that does not attack the silicides, the gate sidewall spacers, or the substrate.

As was noted above, the energetic ions employed in a conventional amorphization process readily pass through the grain boundaries of the polycrystalline gate electrodes into the channel regions of the substrate beneath the gate electrodes. Regions of nonuniform dopant concentration 110 are thereby generated at random within the channel regions of the substrate, which cause unpredictable (and thus unwanted) variations in the threshold voltage of the MOS transistors being fabricated.

SUMMARY OF THE INVENTION

An object of the present invention is thus to provide an amorphization process that facilitates the formation of a salicide structure during fabrication of an MOS device but does not cause random variations in the threshold voltage of the device's MOS transistors. The amorphization process of the present invention includes two distinct implantations, both of which follow formation of the lightly-doped source/drain regions but precede formation of the self-aligned silicides. The first step of the amorphization process consists of implantation of low-energy heavy ions whose energies are sufficient to form thin, first amorphous layers at the surface of the single-crystal silicon substrate and at the surface of the polycrystalline gate electrodes, but insufficient to pass through the grain boundaries of the gate electrodes. The second step of the amorphization process consists of implantation of more energetic heavy ions whose energies would be sufficient to pass through the grain boundaries of the polysilicon gate electrodes into the channel region but for the presence of the first amorphous layer, which serves to scatter the collimated incident ions of the second implantation into random directions.

A method embodying the invention could also include the steps of forming a gate electrode on a surface of a substrate; forming source/drain regions in the substrate on either side of the gate electrode; implanting a first species of ions having a first energy into the gate electrode and the substrate to form continuous amorphous layers on a top surface of the gate electrode and the surface of the substrate; and implanting a second species of ions having a second energy, greater than the first energy, into the gate electrode and the substrate so that the second species of ions penetrate further into the top surface of the gate electrode and the substrate to form deeper amorphous layers in the gate electrode and the substrate.

BRIEF DESCRIPTION OF THE DRAWINGS

None of the figures briefly described below are drawn to scale. As is common in the art of integrated circuit representation, the thicknesses and lateral dimensions of the various layers shown in the figures were chosen only to enhance the legibility of the figures.

DETAILED DESCRIPTION OF THE PREFERRED EMBODIMENTS

Process steps of a method of fabricating an MOS device that includes self-aligned silicides according to an embodiment of the present invention are described immediately below with reference to the idealized cross-sectional views of FIGS. 2A–2G.

Figure 1A:
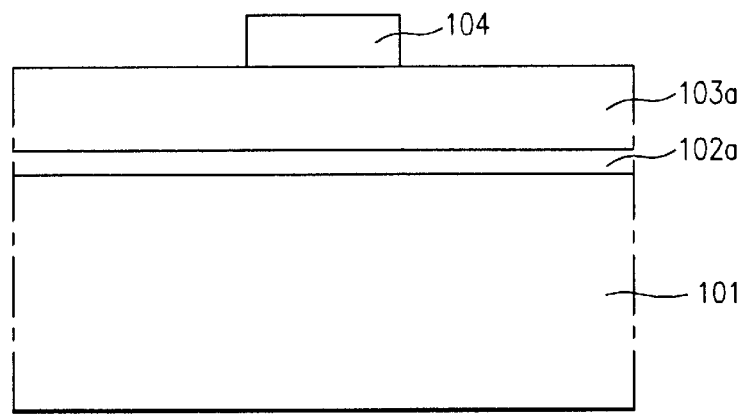
FIGS. 1A–1F are idealized cross-sectional views which illustrate process steps of a conventional method of fabricating an MOS device that includes self-aligned silicides.
Figure 1B:
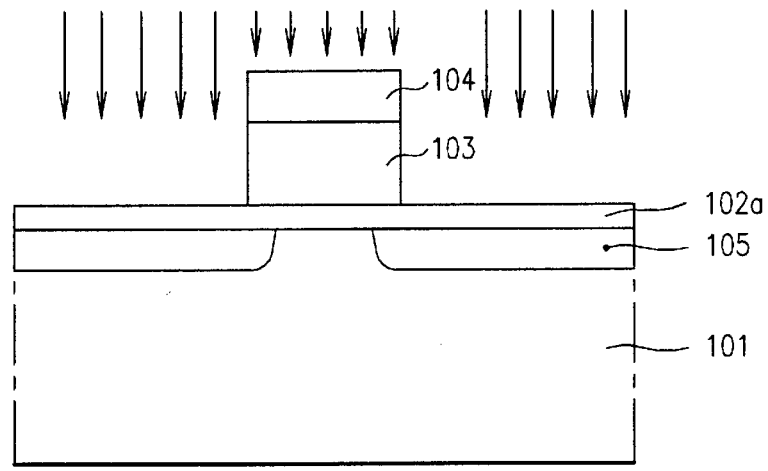
Figure 1C:
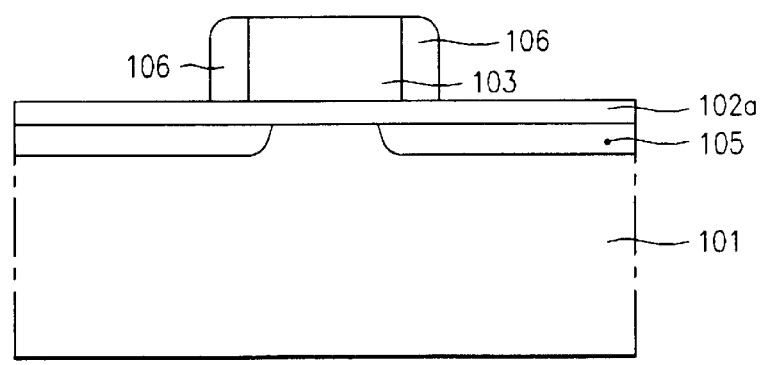
Figure 1D:
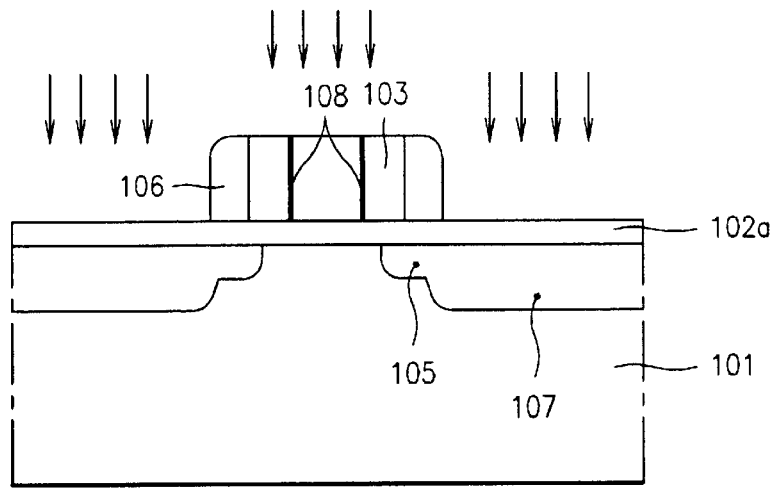
Figure 1E:
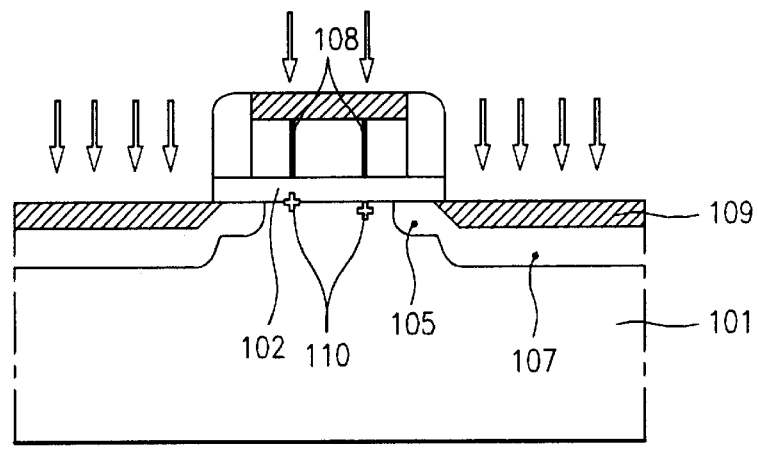
Figure 1F:
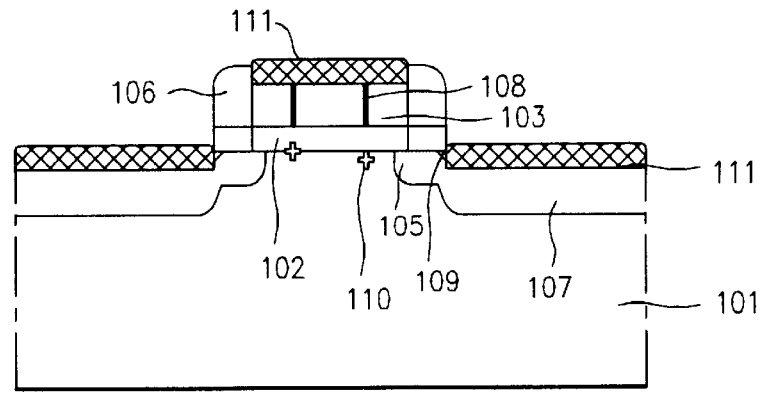
Figure 2A:
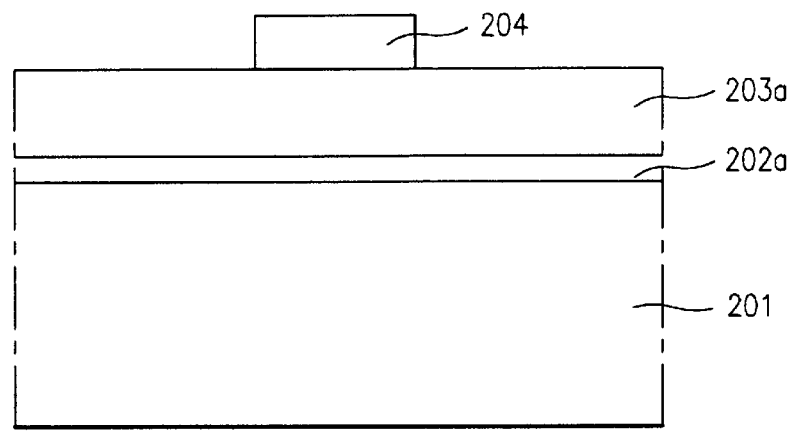
FIGS. 2A–2G are idealized cross-sectional views which illustrate process steps of a method of fabricating an MOS device that includes self-aligned suicides according to an embodiment of the present invention.

As shown in FIG. 2A, a thin, insulating thermal oxide film 202a is grown on the surface of a lightly-doped semiconductor substrate 201 of a first conductivity type and a doped polysilicon layer 203a is formed on the thin oxide film 202a. After a first photoresist coating has been spun onto the polysilicon layer, the photoresist coating is patterned by means of conventional exposure and development process steps to form a photoresist pattern 204.

Figure 2B:
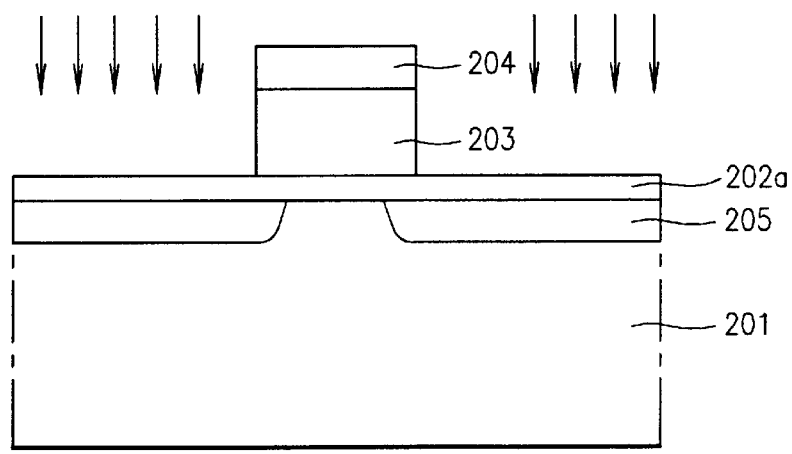

Masked by the photoresist pattern 204, the polysilicon layer 203a is etched in order to form regularly-spaced, parallel gate electrode strips 203, as shown in FIG. 2B. After the photoresist pattern 204 has been removed, low-energy dopants of a second conductivity type are implanted into the substrate, which is masked by the gate electrode 203, and electrically activated by means of a thermal process (e.g., rapid thermal processing) to form shallow, lightly-doped source/drain regions 205 within the substrate 201 to either side of each of the gate electrodes 203. (Alternatively, the photoresist pattern may be removed after, rather than before, the implantation has been performed.) Lightly-doped source/drain regions 205 are thus self-aligned to each of the gate electrodes 203.

Figure 2C:
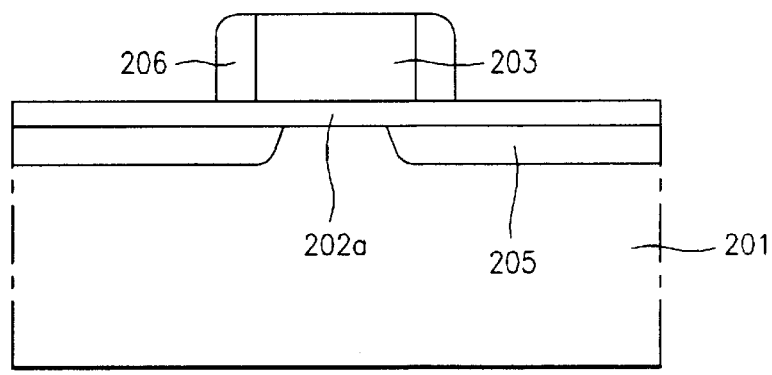

As shown in FIG. 2C, an oxide film is deposited over the surface of the substrate and then etched-back to form oxide sidewall spacers 206 contiguous to either side of each of the gate electrodes 203. A gate electrode structure is again conveniently defined to consist of a gate electrode 203 and the sidewall spacers 206 contiguous to that gate electrode.

Figure 2D:
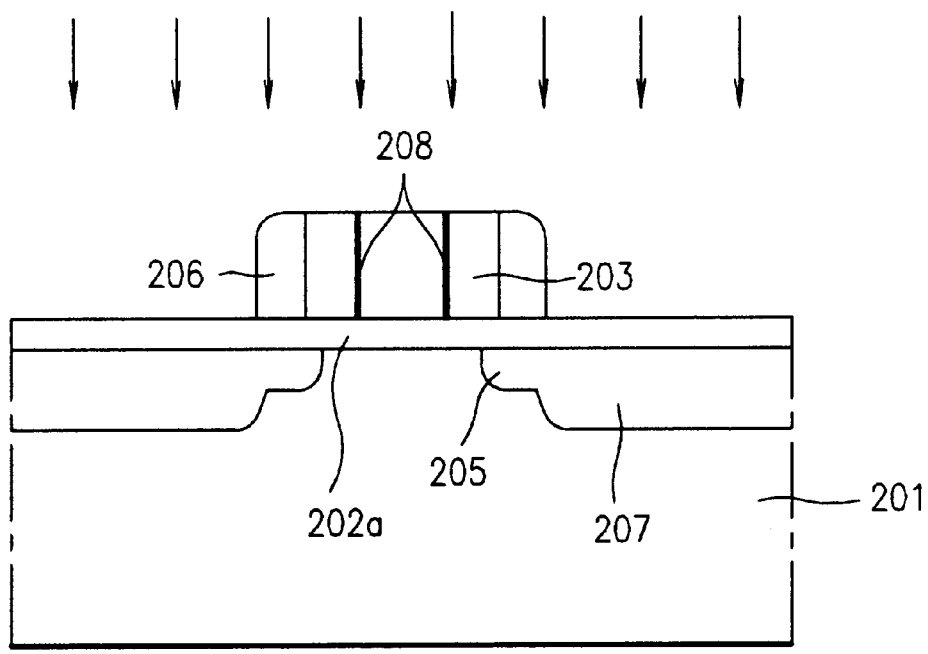

As shown in FIG. 2D, energetic dopants of the second conductivity type are implanted into the substrate, which is masked by the gate electrode structures, and then electrically activated by means of a thermal process in order to form heavily-doped source/drain regions 207 within the substrate to either side of each of the gate electrode structures. (Alternatively, dopants that will comprise both the lightly- and heavily-doped source/drain regions may be electrically activated at the same time by means of a single thermal process after the later implantation.)

Heavily-doped source/drain regions 207 are thus self-aligned to any given gate electrode structure and extend further beneath the surface of the substrate than do the lightly-doped source/drain regions 205 which are also self-aligned to the given gate electrode structure. Additional grain boundaries 208 are generated in the polycrystalline gate electrodes by dopants which impinge on the gate electrodes 203 during the implantations which precede formation of the source/drain regions. Exposed regions of the thermal oxide film 202a are removed after implantation of the ions that will comprise the heavily-doped source/drain regions 207, thereby forming insulating gate oxides 202 which separate the gate electrode structures from the substrate. (The exposed regions of the thermal oxide film 202a may alternatively be removed after formation of the gate sidewall spacers 206, after implantation of the ions that will comprise the lightly-doped source/drain regions 205, or after formation of the gate electrodes 203.)

Figure 2E:
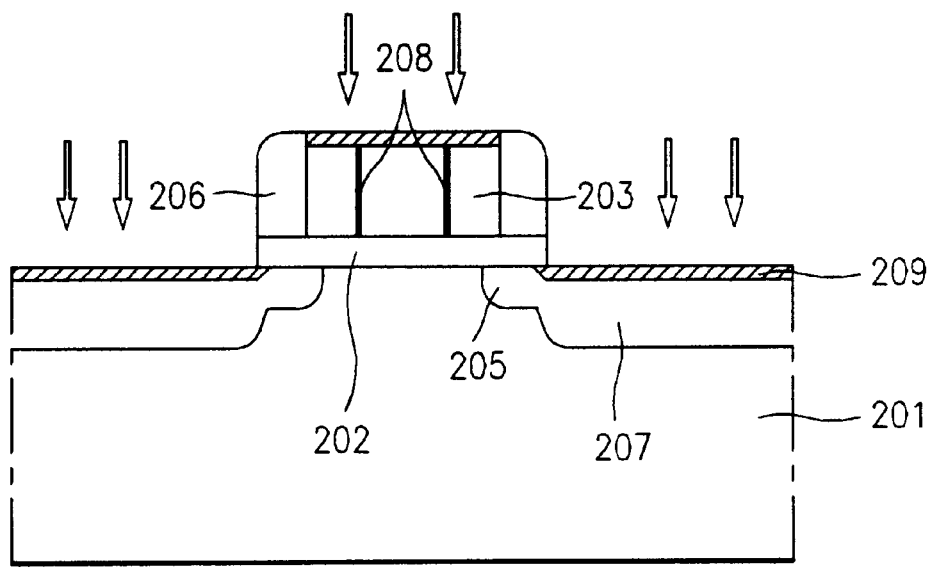

As shown in FIG. 2E, a first species of heavy ions of the second conductivity type (preferably $As^-$ for a lightly-doped p-type substrate or $BF_2^+$ for a lightly-doped n-type substrate) of energy no greater than 20 keV (preferably 15–20 keV) is implanted into the gate electrodes and the substrate in order to form thin first amorphous layers 209 (preferably of thickness 50–300 Å) at the upper surface of each of the polycrystalline gate electrodes 203 and at the surface of the single-crystal substrate above each of the heavily-doped source/drain regions 207, respectively. The heavy ions employed in this first amorphization process step of the present invention are sufficiently energetic and the dose of these ions is sufficiently large that well-defined, continuous amorphous layers, not localized amorphous regions, result from this implantation. The energy of the incident ions is, however, sufficiently low that the ions cannot pass through grain boundaries of the polysilicon gate electrodes 203, including the grain boundaries 208 generated during formation of the source/drain regions.

Figure 2F:
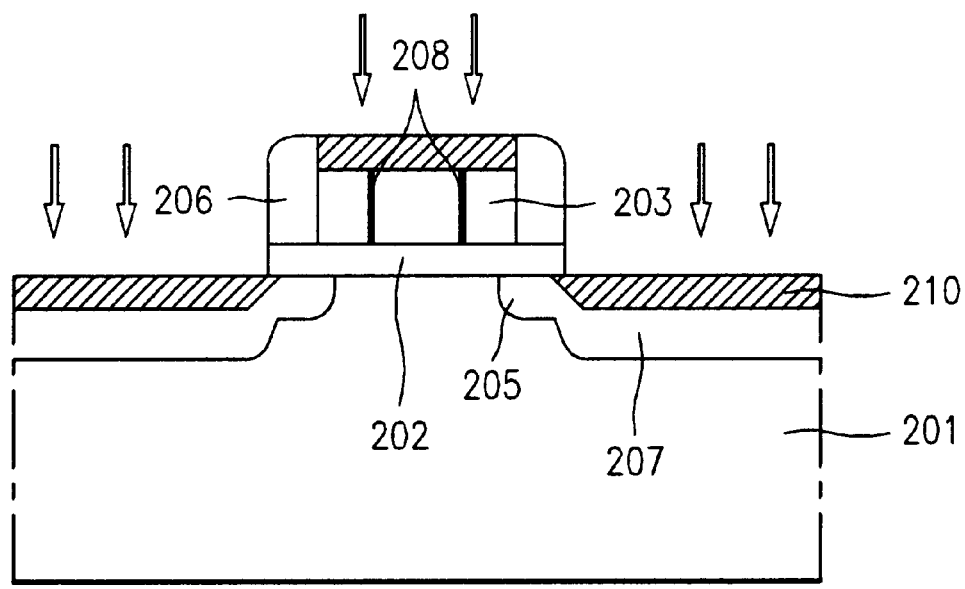

As shown in FIG. 2F, a second species of heavy ions of the second conductivity type (preferably the same species as that employed in the first amorphization process step of the present invention) of energy at least 40 keV (preferably 40–45 keV) is implanted into the gate electrodes and the substrate in order to form second amorphous layers 210 that extend further beneath the upper surfaces of the gate electrodes and the substrate than do the first amorphous layers 209. Even though the second amorphization process step employs ions of energy at least 40 keV, these ions do not pass through the grain boundaries of the gate electrode, because the first amorphous layers 209 act as diffusers. That is, the first amorphous layers tend to scatter the incident collimated ions of the second amorphization implantation into random directions.

Figure 2G:
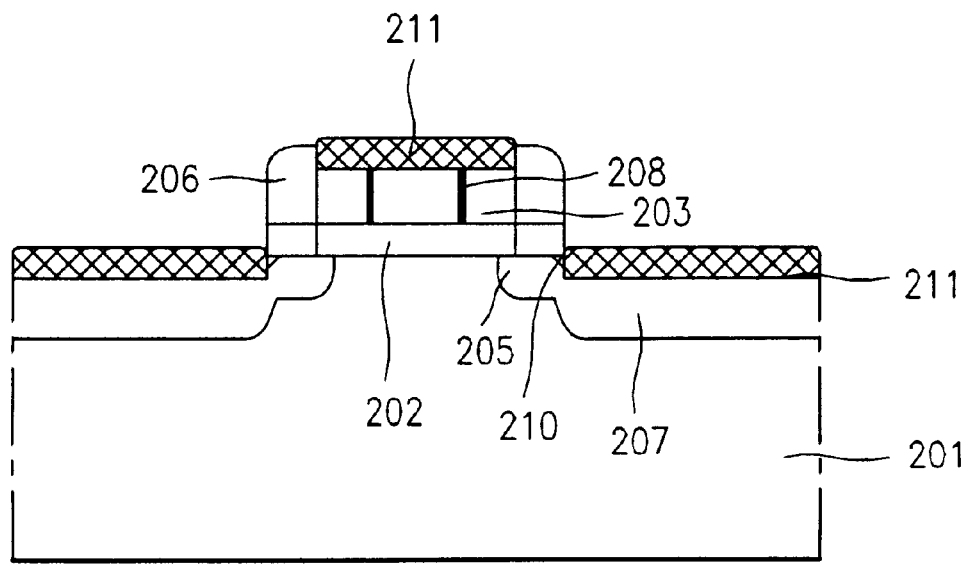

As shown in FIG. 2G, a metal layer is deposited over the upper surface of the substrate and annealed. Silicon of the amorphized regions 209 and 210 of the polysilicon gate electrodes 203 and the single-crystal silicon substrate reacts with the deposited metal to form silicide layers 211 of uniform electrical and mechanical properties at the surface of each of the gate electrodes 203 and at the surface of the substrate above each of the heavily-doped source/drain regions 207. Silicide layers on the surface of the substrate are thus self-aligned to the gate electrode structures. Unreacted metal, deposited, for example, on the gate sidewall spacers, is removed by means of a selective etch that does not attack the silicides, the gate oxide spacers, or the substrate.

Two distinct amorphization implantations are implemented during the fabrication of an MOS device according to the method of the present invention. The first employs heavy ions of energy no greater than 20 keV to form continuous amorphous layers at the surface of the gate electrodes and the substrate above the heavily-doped source/drain regions, while the second employs heavy ions of energy at least 40 keV. The incident heavy ions of the second amorphization implantation are scattered into random directions by the ions of the first amorphization implantation and thus do not form regions of nonuniform dopant concentration within the channel regions of the substrate.

The embodiments described above are intended to illustrate the claimed invention, but not to exhaustively delineate every detail of the invention as practiced. It will be apparent to those of ordinary skill in the art of MOS device fabrication that various modifications and variations of the method of the present invention may be made without departing from either the spirit or the scope of the invention. The present invention is thus intended to cover such modifications and variations provided they fall within the scope of the appended claims and their equivalents.

What is claimed is:

1. A method of fabricating a semiconductor device on a substrate of a first conductivity type, the substrate having a surface, the method comprising the steps of:

forming a gate electrode over the surface of the substrate, the gate electrode having a surface;

forming source/drain regions of a second conductivity type within the substrate to either side of the gate electrode;

implanting a first species of ions of the second conductivity type with a first energy into both the gate electrode and the substrate, thereby forming first amorphous layers at the surface of the gate electrode and the surface of the substrate above the source/drain regions, respectively, wherein the first energy is selected so that the first species of ions do not pass through the gate electrode to an underlying portion of the substrate;

implanting a second species of ions of the second conductivity type with a second energy into both the gate electrode and the substrate, thereby forming second amorphous layers within the substrate; and forming silicide layers at the surface of the gate electrode and at the surface of the substrate above the source/drain regions, thereby fabricating the semiconductor device.

2. The method according to claim 1, wherein the second energy is greater than the first energy.

3. The method according to claim 2, wherein the first species of ions is the same as the second species of heavy ions.

4. The method according to claim 3, wherein the first energy is no greater than aproximately 20 keV.

5. The method according to claim 4, wherein the first energy is aproximately 15–20 keV.

6. The method according to claim 5, wherein the first amorphous layers have thicknesses of aproximately 50–300 Å.

7. The method according to claim 2, wherein the second energy is at least aproximately 40 keV.

8. The method according to claims 3, wherein the second energy is at least aproximately 40 keV.

9. The method according to claim 4, wherein the second energy is at least aproximately 40 keV.

10. The method according to claim 5, wherein the second energy is at least aproximately 40 keV.

11. The method according to claim 6, wherein the second energy is at least aproximately 40 keV.

12. The method according to claim 1, wherein the first energy is selected so that the first amorphous layers are formed as continuous amorphous layers at the surface of the gate electrode and the surface of the substrate above the source/drain regions, respectively.

13. The method according to claim 1, wherein the first energy is selected so that the first amorphous layers are continuous and have a thickness that allow scattereing of the second species of ions implanted into the gate electrode so that the second species of ions do not pass through the gate electrode to an underlying portion of the substrate.

14. The method according to claim 1, wherein the second energy is selected so that the second species of ions penetrate a greater distance into the gate electrode and the substrate than the first species of ions.

15. The method according to claim 14, wherein the second energy is selected so that the second species of ions do not pass through the gate electrode to an underlying portion of the substrate.

16. A method of fabricating a semiconductor device, comprising the steps of:

forming a gate electrode on a surface of a substrate;

forming source/drain regions in the substrate on either side of the gate electrode;

implanting a first species of ions having a first energy into the gate electrode and the substrate to form continuous amorphous layers on a top surface of the gate electrode and the surface of the substrate; and implanting a second species of ions having a second energy, greater than the first energy, into the gate electrode and the substrate so that the second species of ions penetrate further into the top surface of the gate electrode and the substrate to form deeper amorphous layers in the gate electrode and the substrate.

17. The method of claim 16, wherein the step of implanting a first species of ions is conducted with a first energy for formation of an amorphous layer on the gate electrode that will prevent the second species of ions from passing through the gate electrode to an underlying portion of the substrate.

18. The method of claim 16, wherein the first energy is less than approximately 20 keV.

19. The method of claim 18, wherein the second energy is more than approximately 40 keV.

20. The method of claim 16, wherein the second energy is selected to that the second species of ions do not pass through the gate electrode to an underlying portion of the substrate.

* * * * *